United States Patent [19]
Yoshikawa

[11] Patent Number: 4,989,544
[45] Date of Patent: Feb. 5, 1991

[54] APPARATUS FOR FORMING FUNCTIONAL DEPOSITED FILMS BY WAY OF HYBRID EXCITATION

[75] Inventor: Toshiaki Yoshikawa, Kawasaki, Japan

[73] Assignee: Canon Kabushiki Kaisha, Tokyo, Japan

[21] Appl. No.: 469,393

[22] Filed: Jan. 24, 1990

[30] Foreign Application Priority Data

Jan. 26, 1989 [JP] Japan .................................. 1-14995
Dec. 28, 1989 [JP] Japan .................................. 1-338400

[51] Int. Cl.$^5$ .......................................... C23C 16/50
[52] U.S. Cl. .................................. 118/723; 118/722; 118/725; 118/50.1
[58] Field of Search ............... 118/722, 723, 725, 50.1

[56] References Cited

U.S. PATENT DOCUMENTS

4,773,355 9/1988 Reif ...................................... 118/725

Primary Examiner—Richard Bueker
Attorney, Agent, or Firm—Fitzpatrick, Cella, Harper & Scinto

[57] ABSTRACT

In an apparatus for forming a deposited film on a substrate by the hybrid excitation chemical vapor deposition method, said apparatus comprising a substantially enclosed reaction vessel having means for holding said substrate thereon, a plasma generating means and means for irradiating light through a light introducing window provided with said reaction vessel to the surface of said substrate in said reaction vessel; the improvement that at least part of the circumferential side wall of said reaction vessel is hermetically constituted by an insulating member having an external cathode electrode member on the outer surface thereof, said external cathode electrode member being electrically connected to a high frequency power source, an internal electrode member to serve as the anode is installed in said reaction vessel at a position opposite to said external cathode electrode member, said internal electrode member being electrically grounded, said means for holding the substrate is positioned below said internal electrode member, said reaction vessel is provided with a gas feed pipe for supplying a raw material gas capable of producing a plasma which is open into the space between said insulating member and said internal electrode member, a light source for irradiating light to the surface of said substrate is disposed above said internal electrode member such that the path of said light is made coaxial with said reaction vessel, and said reaction vessel is provided with a gas feed pipe having a plurality of gas spouting holes for supplying a film-forming raw material gas above said means for holding the substrate.

7 Claims, 8 Drawing Sheets

PRIOR ART

FIG. 4

PRIOR ART

APPARATUS FOR FORMING FUNCTIONAL DEPOSITED FILMS BY WAY OF HYBRID EXCITATION

FIELD OF THE INVENTION

This invention relates to an apparatus for forming, using a chemical vapor deposition method, a functional deposited film which is usable as a constituent element in semiconductor devices, electrophotographic photosensitive devices, etc. More particularly, the present invention relates to an improved apparatus suitable for the formation of a passivation film usable for isolating a semiconductor integrated circuit device or a large scale integrated circuit device from an external field.

BACKGROUND OF THE INVENTION

Conventionally, known as a method of forming a functional deposited film are a vacuum vapor deposition method, a high frequency (RF) plasma chemical vapor deposition method, a thermal-induced chemical vapor deposition method (hereinafter referred to as "heat CVD method"), a reactive sputtering method, an ion plating method and a light-induced chemical vapor deposition method (hereinafter referred to as "light CVD method"). These methods are selectively used depending upon the type of a functional deposited film to be formed or the desired application use of a functional deposited film formed.

For any of these film-forming methods, there still exist unsolved problems. That is, the heat CVD method is to form a functional deposited film by thermally decomposing a film-forming raw material gas with the action of heat to cause the formation of said functional deposited film on the surface of a substrate maintained at a desired temperature. However, in the case of this thermal-induced chemical vapor deposition method, there is an unavoidable disadvantage that this method can be applied only in the formation of limited kinds of functional deposited films because this method involves a high temperature heat decomposition reaction. Meanwhile, the RF plasma chemical vapor deposition method (hereinafter referred to as "RF PCVD method") is to form a functional deposited film by causing plasma discharge in a film-forming raw material gas at a relatively low temperature with the action of energy of a RF power to generate active species and chemically reacting those active species thus generated to form said functional deposited film on the surface of a substrate maintained at a desired temperature. Although the RF-PCVD method is widely used nowadays, the method is problematical due to the fact that there are a number of varied film-forming parameters which are much more complicated than the heat CVD method and those film-forming parameters are extremely difficult to be generalized. The light CVD method is to form a functional deposited film by exciting and promoting chemical reactions of one or more of film forming raw material gases with the action of light energy to form said functional deposited film on the surface of a substrate maintained at a desired temperature. The light CVD method is advantageous in the viewpoints that it is free of such a problem that the characteristics of a film to be formed by the HR-PCVD method are likely to vary because of collision of high energy particles to the substrate or/and the presence of charged particles and it makes possible to form a functional deposited film at low temperature.

However, there is a disadvantage for the light CVD method that there is a restriction in the wavelength of light which is absorbed by a film-forming raw material gas and because of this, there is a limit for the kind of a functional deposited film which can be formed by this method.

Various proposals have been made in order to solve such problems of various chemical vapor deposition methods as described above. One of such proposals provides an improved high frequency plasma chemical vapor deposition method in which hybrid excitation is utilized. The improved method will be described below.

By the way, a passivation film has been conventionally used to isolate a semiconductor integrated circuit device or a large scale semiconductor integrated circuit device from an influence of the external field in order to ensure the reliability of such semiconductor integrated circuit device, particularly of the large scale semiconductor integrated circuit device. There have been proposed a phosphor silicate film, a $SiO_2$ film or the like as the passivation film. However, any of them does not have a sufficient blocking effect against $H_2O$, Na ion or the like.

Under this circumstance, the use of a $Si_3N_4$ film as the passivation film has been discussed since it is chemically inactive and is superior to any of the phosphor silicate film and $SiO_2$ film with respect to hardness and density and because of this, it can be expected to provide a desirable blocking effect against impurities such as $H_2O$, Na ions and the like. However, for the reason that it is necessary for a wafer on which said film is to be formed to be heated to an elevated temperature of 800° C. or more upon formation thereof, said $Si_3N_4$ film has not been yet put to practical use.

Recently, Mikio KOBAYAKAWA et al. have proposed a method of forming a $Si_3N_4$ film at a temperature of about 300° C. by means of PCVD technique (see, periodical journal "SHINKU" (Vacuum) vol. 31, No. 3, p. 167).

Figure 3:
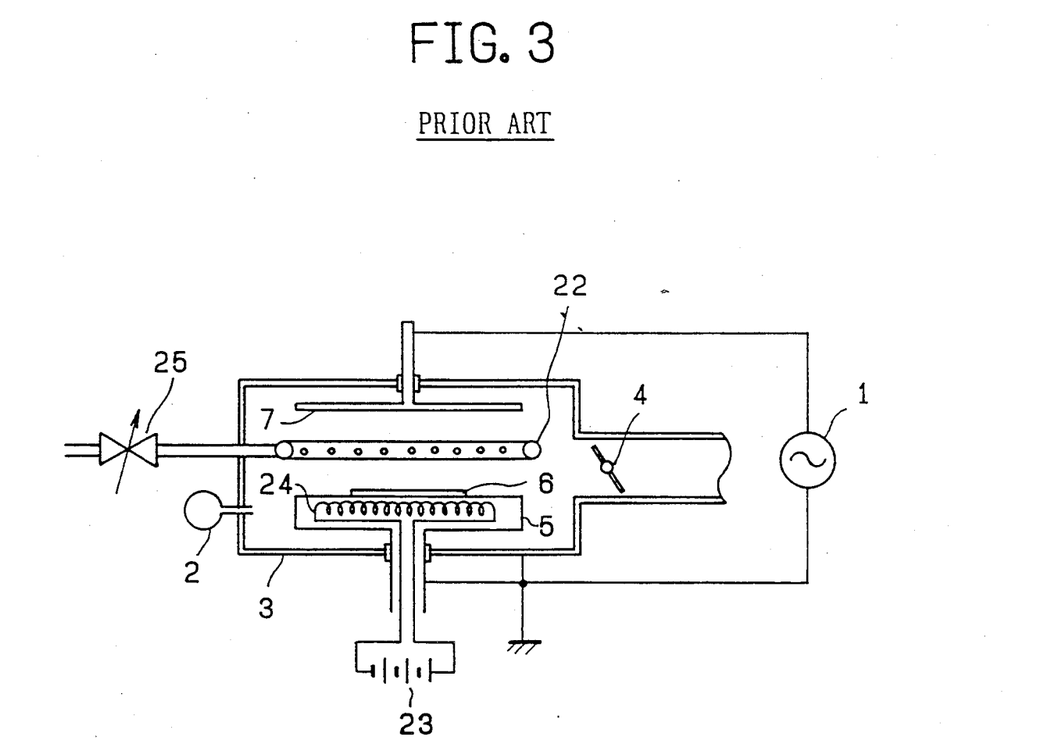
FIG. 3 is a schematic sectional view of a conventional apparatus for forming a deposited film by the PCVD method.

In the following, the method of forming a $Si_3N_4$ film by the PCVD technique proposed by KOBAYAKAWA et al. will be explained with reference to the drawing (FIG. 3).

In FIG. 3, there is shown a schematic representation of a film forming apparatus by the PCVD method. Formation of a $Si_3N_4$ film in the apparatus is carried out in the following manner. That is, a vacuum valve 4 is opened to exhaust the remaining gas in a vacuum vessel 3. Then, a gas mixture comprising $SiH_4$ gas and $NH_3$ gas is introduced into the vacuum vessel 3 from a gas spouting ring 22 while controlling its flow rate by a control valve 25. Thereafter, the gas pressure (inner pressure) of the vessel 3 is adjusted to 10 torr or so by mean of the valve 4, and a wafer 6 placed on a wafer holder 5 is heated to 300° C. by means of a heater 24. Then, a RF (radio frequency) power (13.56 MHz) from a RF power source 1 is applied between a cathode electrode 7 and the wafer holder 5. Thereupon, an electric field is generated. Consequently, glow discharge is caused between the cathode electrode 7 and the wafer holder 5 to form plasma wherein said $SiH_4$ gas and $NH_3$ gas are decomposed to generate active species which are successively chemically reacted, whereby a $Si_3N_4$ film is formed on the surface of the water.

Figure 5:
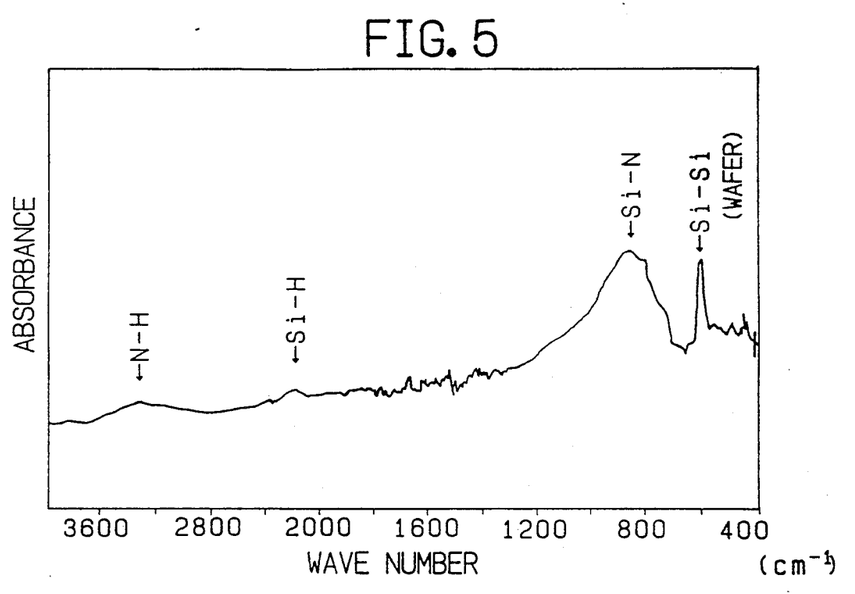
FIG. 5 shows an infrared absorption spectrum of a $Si_3N_4$ film formed by the apparatus shown in FIG. 3.

However, the $Si_3N_4$ film thus formed by this PCVD method unavoidably contains about 20 atomic % of hydrogen atoms in the form of Si—H bonds or/and N—H bonds. In this respect, in the case where the Si₃N₄ film is used in a MOS device, the hydrogen atoms contained in the Si₃N₄ film move to the interface between a gate electrode and a silicon surface to trap hot electrons therein. This causes a change in the threshold and also a deterioration of the MOS device. There is shown an infrared absorption spectrum of a Si₃N₄ film formed by the foregoing PCVD method in FIG. 5.

In order to solve the foregoing problems, utilization of a so-called hybrid excitation chemical vapor deposition method in Knudsen region (hereinafter referred to as "Knudsen region hybrid excitation CVD method") has been discussed.

The Knudsen region hybrid excitation CVD method comprises supplying a film-forming raw material gas comprising SiH₄ gas and NH₃ gas excited by way of a RF glow discharge toward the surface of a substrate (wafer) on which a film is to be deposited and irradiating said surface with UV-rays from an ultraviolet lamp to thereby form a deposited film on said surface activated with the irradiation of the UV-rays. With this method, the film is formed on said wafer surface as a bonded product of SiN radicals, SiH radicals and NH radicals. The film formed by this Knudsen region hybrid excitation CVD method comprises a SiN system film containing SiN component and NH component as the main constituents and SiH component in a slight amount. Upon forming the SiN film by this Knudsen method, as NH radicals absorb light having a wavelength shorter than 450 nm, they are decomposed and desorbed into a gaseous phase.

Thus, the resulting SiN system film becomes such that contains hydrogen atoms (H) in a relatively small amount of less than 10 atomic %. The Knudsen region hybrid excitation CVD method is practiced, for example, in the apparatus shown in FIG. 4.

Figure 4:
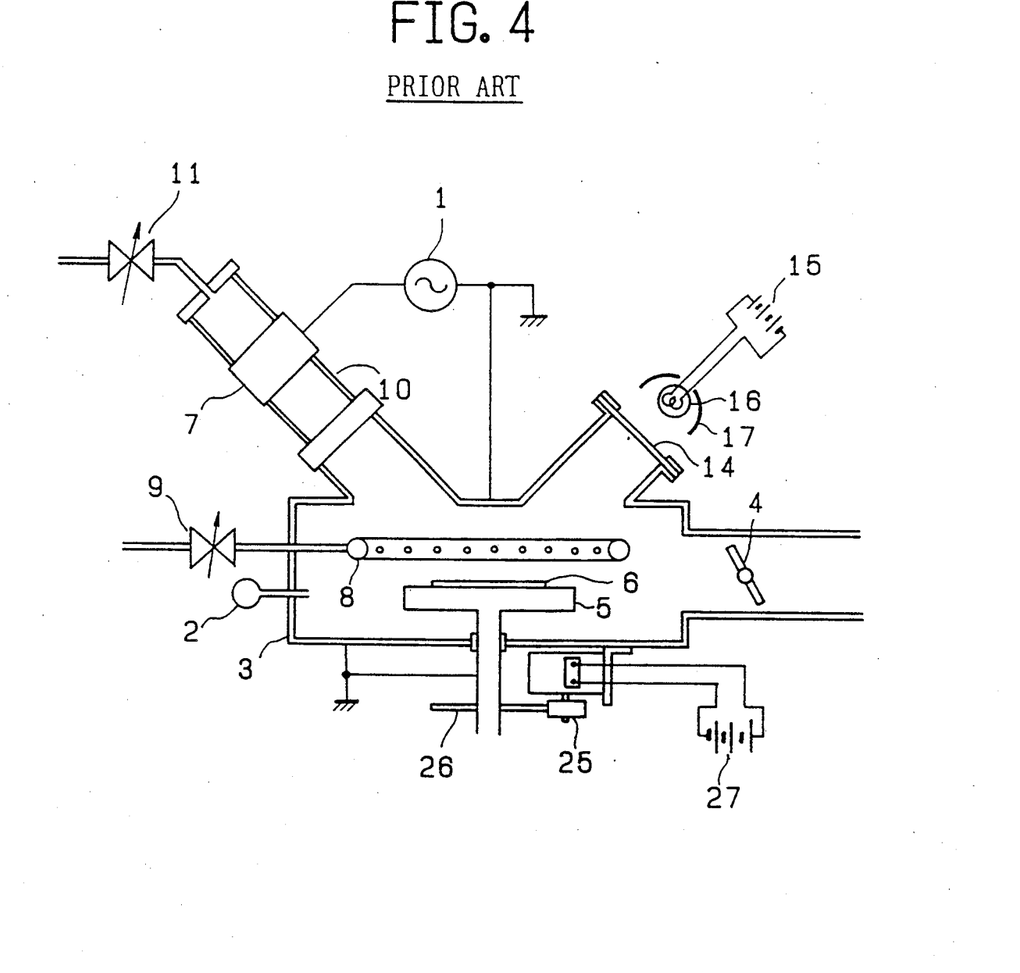
FIG. 4 is a schematic sectional view of a conventional apparatus for forming a deposited film by the hybrid excitation method.
Figure 6:
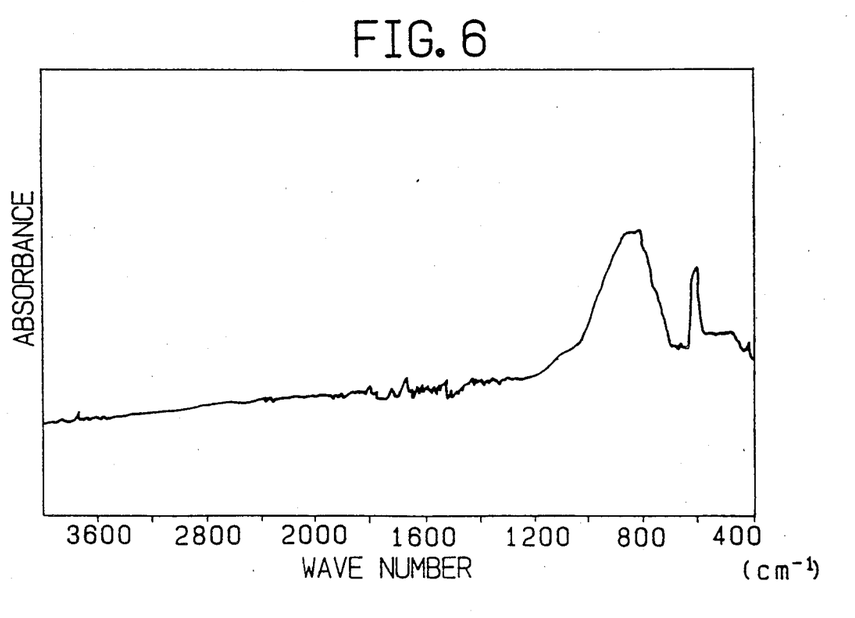
FIG. 6 shows an infrared absorption spectrum of a $Si_3N_4$ film formed by the apparatus shown in FIG. 4.

In FIG. 6, there is shown an infrared absorption spectrum of a SiN film formed by the foregoing Knudsen region excitation CVD method by using the apparatus shown in FIG. 4.

FIG. 4 shows a schematic representation of an apparatus for forming a deposited film by the Knudsen region hybrid excitation CVD method. Referring to FIG. 4, the apparatus shown includes a high frequency power source 1, a vacuum gage 2, a reaction vessel 3 made of a conductive material, an exhaust valve 4, a wafer holder 5 for holding thereon a wafer 6 on which a deposited film is to be formed, a cathode electrode 7, a SiH₄ gas spouting ring 8, a flow rate control valve 9 for SiH₄ gas, a cylindrical excitation chamber 10 made of an insulating material, a flow rate control valve 11 for N₂ gas, a light transmitting window 14 for transmitting light from a xenon lamp 16 therethrough, a power source 15 for the xenon lamp 16, a mirror 17 for reflecting light from the xenon lamp 17, a motor 25 for rotating the wafer holder 5 by way of a gear 26, and a power source 27 for the wafer holder rotating motor 25.

Formation of a deposited film by the Knudsen hybrid excitation CvD method using the apparatus shown in FIG. 4 is carried out, for example, in the following manner. That is, in the case where a SiN film is to be formed on a wafer 6, the reaction vessel 3 is evacuated by operating the exhaust valve 4. Then N₂ gas is introduced through the excitation chamber 10 into the reaction vessel 3 while controlling its flow rate by the flow rate control valve 11. At the same time, SiH₄ gas is introduced into the reaction vessel 3 while controlling its flow rate by the flow rate control valve 9. The SiH₄ gas is spouted from the spouting ring 8 toward the wafer 6 placed on the wafer holder 5. The inner pressure of the reaction vessel 3 is adjusted by means of the exhaust valve 4. RF power (13.56 MHz) is applied from the RF power source 1 to the cathode electrode 7 to cause glow discharge between the cathode electrode 7 and the circumferential wall of the reaction vessel 3 being electrically grounded, so that the N₂ gas is excited to generate plasmas which are successively dispersed in the entire inside space of the reaction vessel 3. The SiH₄ gas spouted from the spouting ring 8 toward the surface of the wafer 6 reacts with the plasmas caused from N₂ to form a deposited film on the surface of the wafer 6. In this case, ultraviolet rays from the xenon lamp 16 are irradiated onto the surface of the wafer 6. Consequently, a SiN film is formed.

Figure 7A:
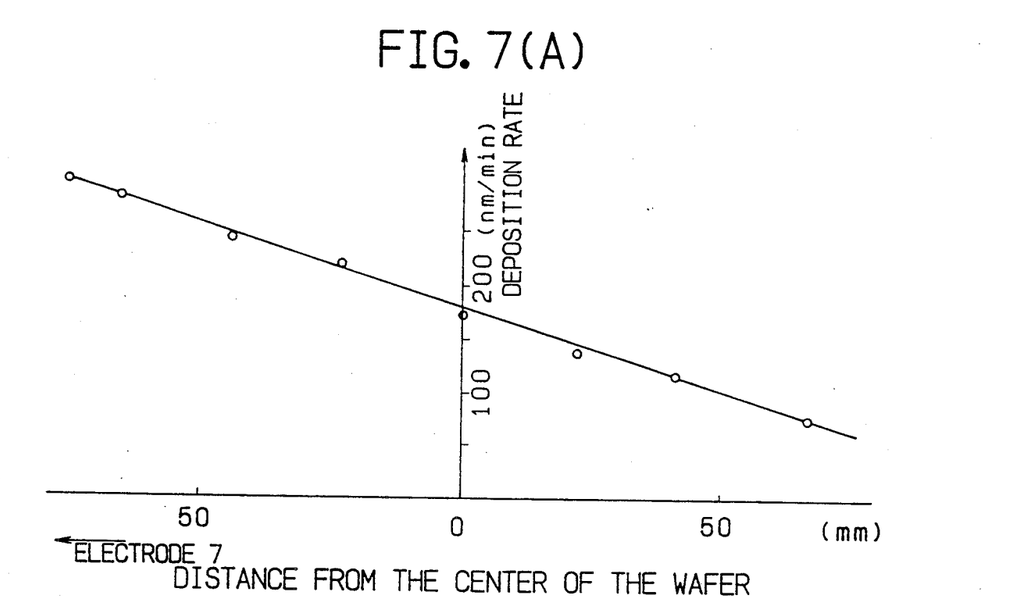
Figure 7B:
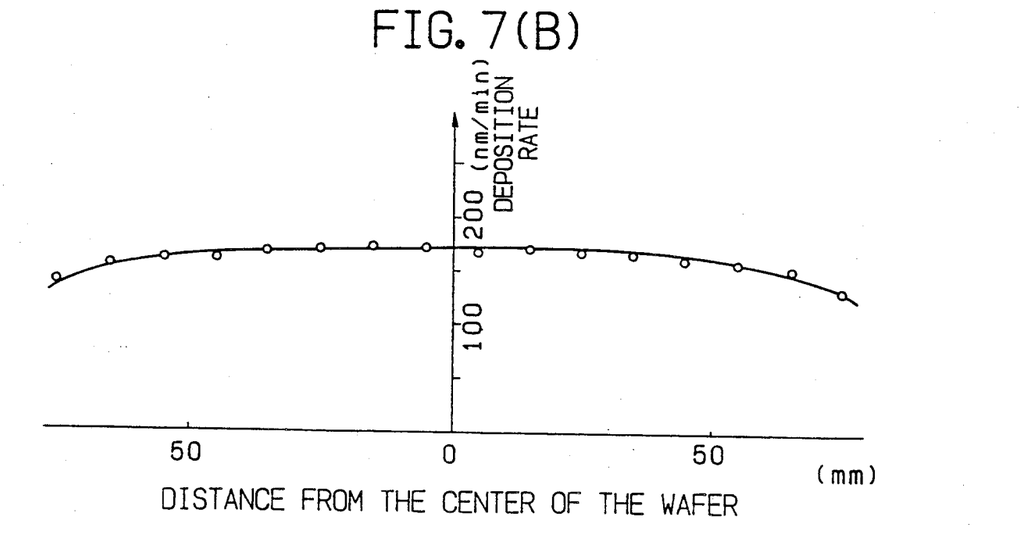

With this known method, there is a problem that, since the plasmas flow into the reaction vessel 3 in one direction, the density of the plasmas in the reaction vessel becomes to be of such a distribution that shows a maximum value at a position displaced from the center of the reaction vessel 3. Actual measurement of such plasma density by the present inventor has proved that the plasma density decreases as the distance from the cathode electrode 7 increases. Specifically, when an RF power of 2.2 w/cm² was applied to the cathode electrode 7 while the pressure of N₂ gas was 10 mTorr, the plasma density was $2 \times 10^{10}$ cm$^{-3}$ at a position of the surface of the wafer 6 near the cathode electrode 7 but was $1 \times 10^9$ cm$^{-3}$ at the central position of the wafer 6. Now, decomposition of SiH₄ gas proceeds fast where the plasma density is high, which gives a significant influence on the in-plane uniformity of the film forming rate and makes the distribution of the thickness of the film on the wafer non-uniform. In this instance, the distribution of the film forming rate was such as shown in FIG. 7(a). In order to improve this deviation, the wafer holder 5 was rotated by the motor 25 by way of the gear 26 as shown in FIG. 4 in order to make the distribution of the film forming rate uniform. In FIG. 7(b), there was shown the distribution of the film forming rate in this case.

Thus the present inventor has found the following facts on the known apparatus for practicing the hybrid excitation CVD method.

(i) Since the wafer holder is rotated in order to make the film forming rate uniform, films formed at different film forming rates overlap with each other in the thickness direction of the film, and accordingly, it is difficult to obtain a film which is uniform in quality.

Figure 7C:
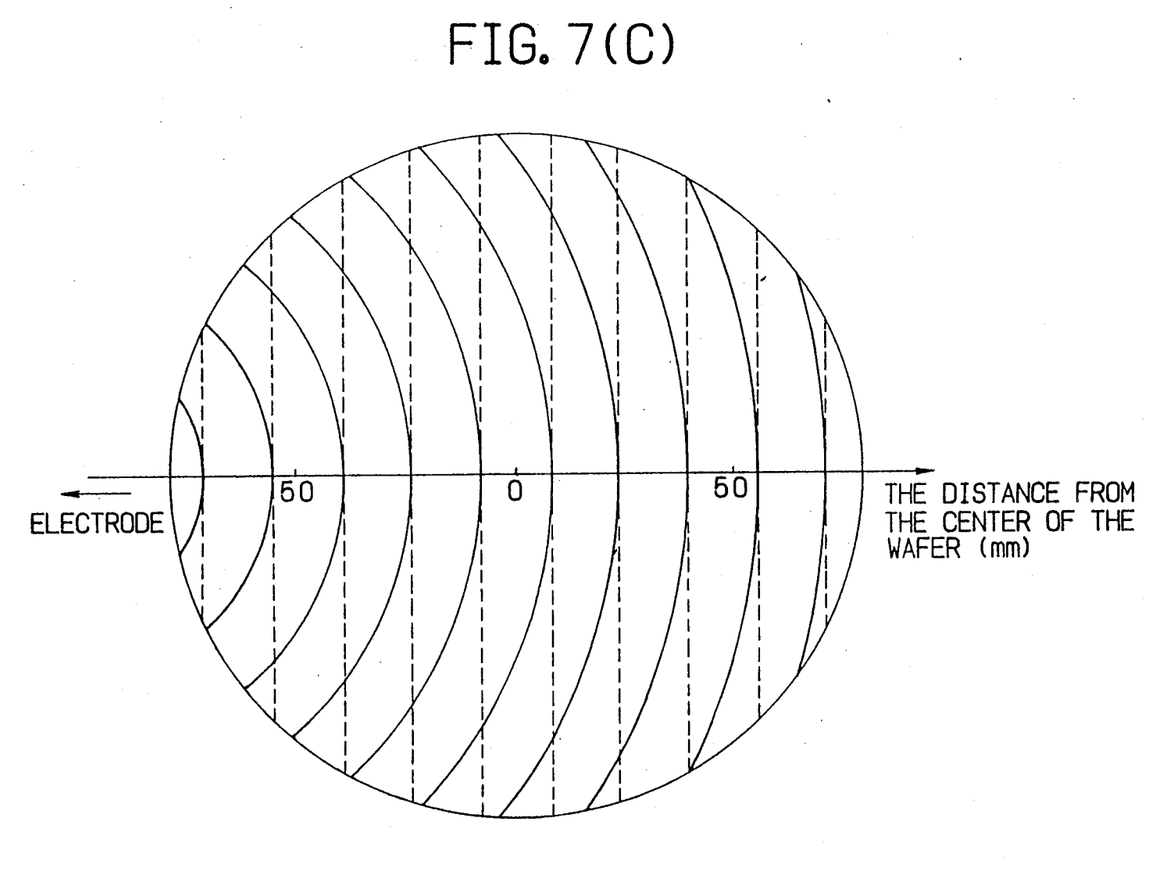

(ii) In order to make the film forming rate uniform by way of rotation of the wafer holder, it is desired for the film forming rate to be distributed in such a way as indicated by the broken lines shown in FIG. 7(c). However, the actual plasma density distribution becomes to present conical shapes having their apex at a position near the cathode electrode. Consequently, the film forming rate distribution becomes to present such state as indicated by the solid lines shown in FIG. 7(c) similarly to the plasma density distribution. As a result, if the wafer holder should be rotated, the film forming rate distribution becomes smaller at the central portion of the wafer than at the peripheral portion of the wafer, and accordingly, there is a limit in this case.

(iii) A rotating mechanism is required to rotate the wafer holder, which complicates the constitution of the apparatus and sometimes causes troubles.

(iv) Further, since the space in which plasmas are caused and the path of light for activating the surface of a substrate are not separated from each other in the conventional apparatus shown in FIG. 4, part of the plasmas caused flows in the vicinity of the light transmitting window 14. Consequently, a deposited film is often formed also on the surface of the light transmitting window 14. This causes problems that not only the light transmitting window becomes not to effectively allow transmission of light into the reaction vessel but also the film deposited thereon is peeled off and incorporated into the film to be formed. In this respect, it is necessary to periodically clean the light transmitting window 14.

SUMMARY OF THE INVENTION

It is an object of the present invention to provide an improved film-forming apparatus which overcomes the foregoing problems of the conventional film-forming apparatus by the hybrid excitation method as described above and is capable of stably and repeatedly forming a desirable deposited film which has a uniform quality and a uniform thickness on the surface of a substrate.

The inventor has made extensive studies in order to overcome the foregoing various problems of the conventional apparatus for forming a deposited film by the hybrid excitation method and in order to attain the object of the invention. As a result, it has been found that the plasma density distribution can be made uniform to enable formation of a deposited film having a uniform film thickness distribution without making use of mechanical movement such as rotation of a substrate on which a deposited film is to be formed in the case where the space in which a raw material gas for the formation of a deposited film is to be excited is made coaxial with but separate from the path of light for activating the surface of a substrate and plasma is caused to diffuse radially and inwardly in a doughnut-like configuration from around an outer periphery of the substrate. It has been also found that deposition of a film on the light introducing window can be prevented and formation of a desired film on the substrate having a large area is enabled in the case where an orifice member is provided between the light introducing window and the substrate and a light irradiating system is provided so that light may be focused at the orifice member.

The present invention has been accomplished based on these findings. The present invention thus provides an improved film-forming apparatus including a reaction vessel for receiving therein a substrate on which a deposited film is to be formed, a plasma generating means, and means for irradiating light to a substrate disposed in the reaction vessel, wherein at least part of a portion of the reaction vessel is constituted by an external electrode isolated from the body of the reaction vessel while an internal electrode is disposed at a position opposite to the external electrode in the reaction vessel; a light source for the irradiation of light is disposed just above the internal electrode such that the path of light for activating the surface of the substrate which is disposed just below the internal electrode is made coaxial with the reaction vessel; the external electrode is connected to a high frequency power source while the internal electrode is grounded; and at least one raw material gas introducing entrance for introducing a raw material gas for the formation of a deposited film into the reaction vessel is provided between the internal electrode and the external electrode. The film-forming apparatus according to the present invention may further include an orifice member disposed between the substrate and the light introducing window for light to activate the surface of the substrate in the reaction vessel, and a light irradiating system disposed such that light introduced into the reaction vessel through the window is focused at the orifice member.

According to the apparatus of the present invention, when, for example, a SiN film is to be formed, plasmas of $N_2$ gas are diffused radially inwardly in a doughnut-like configuration from around an outer periphery of the substrate. Consequently, plasmas from the opposite end portions of the substrate are mixed each other such that the plasma density is made uniform over the entire surface of the substrate. Meanwhile, light from the xenon lamp to be irradiated onto the surface of the substrate passes by the inside of the $N_2$ plasma of a doughnut-like configuration and is irradiated onto the substrate.

Thus, there is formed a desirable SiN film of high quality which is uniform in thickness.

In summary, the apparatus for forming a deposited film by the hybrid excitation CVD method according to the present invention enables achievement of an uniform film thickness distribution without using mechanical movement such as rotation of the substrate by constituting the apparatus such that the space in which plasmas are to be produced is made coaxial with the path of light for the activation of the surface of the substrate and plasmas are caused to diffuse radially inwardly from around the outer periphery of the substrate.

In addition to this, the apparatus according to the present invention makes it possible to prevent a film from depositing on the light introducing window by providing an orifice member between the light introducing window and the substrate and employing an optical system by which light may be focused at the orifice member.

Further, uniform formation of a film on a substrate of a large area is enabled by providing a light irradiating system by which light is focused at the orifice member.

BRIEF DESCRIPTION OF THE DRAWINGS

FIGS. 7(*a*), 7(*b*) and 7(*c*) are graphs showing film forming rate distributions for a 6-inch wafer when the wafer is not rotated, when the wafer is rotated and when the wafer is not rotated, respectively, in forming a film using the apparatus shown in FIG. 4.

DESCRIPTION OF THE PREFERRED EMBODIMENTS

The present invention will be more detailed below with reference to the accompanying drawings, but the description is not intended to restrict the scope of the invention only to the following embodiments.

First Embodiment

Figure 1:
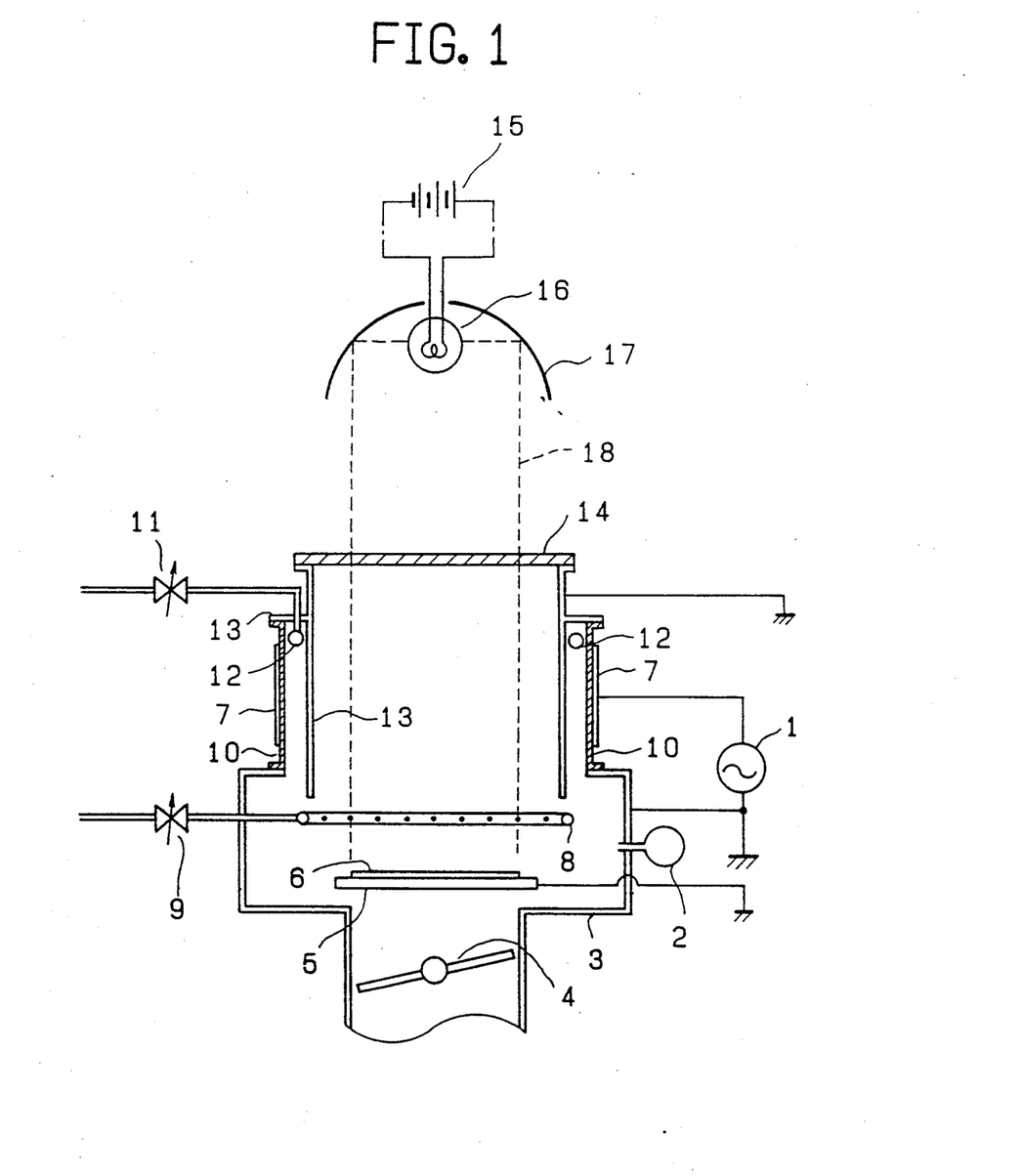
FIG. 1 is a schematic sectional view of a hybrid excitation film forming apparatus showing a preferred embodiment of the present invention.

FIG. 1 shows a schematic sectional view of a typical embodiment of the hybrid excitation film-forming apparatus according to the present invention. The apparatus shown includes an RF (radio frequency) power source 1 for causing RF glow discharge, a substantially enclosed reaction vessel 3 made of a conductive material such as stainless steel, a pressure gage 2 for detecting the inner pressure of the reaction vessel 3, an exhaust valve 4 for adjusting the amount of gas to be exhausted from the reaction vessel 3, a substrate holder 5 for holding thereon a substrate (wafer) 6 on which a deposited film is to be formed, a cathode electrode (external electrode) 7 for applying an RF power into the reaction vessel 3, a ring-shaped gas spouting pipe 8 for spouting SiH$_4$ gas toward the surface of the substrate 6, a valve 9 for controlling the flow rate of SiH$_4$ gas, a side wall member 10 of the reaction vessel 3 which is made of an insulating material such as quartz and on which the external electrode 7 is disposed, a valve 11 for controlling the flow rate of N$_2$ gas, a ring-shaped gas introducing pipe 12 for spouting N$_2$ gas radially and inwardly in a doughnut-like configuration, an internal member (internal electrode) 13 made of a conductive material such as stainless steel which is electrically grounded, a light introducing window 14 made of a material such as quartz which transmits ultraviolet rays therethrough, a xenon lamp 16 for generating ultraviolet rays, a power source 15 for the xenon lamp 16, and a mirror 17 for reflecting the ultraviolet rays from the xenon lamp 16 in a direction toward the substrate 6 in a way that ultraviolet rays from the xenon lamp 16 advance along a light path 18.

The apparatus according to the first embodiment of the present invention is thus characterized by having the substantially enclosed reaction vessel 3 the side circumferential wall of which being constituted by the insulating member 10 having the external cathode electrode 7 on the external surface thereof, the internal electrode member 13 to serve as the anode and the light introducing window 14 being hermetically provided with the reaction vessel 3.

The formation of a SiN film by the foregoing apparatus is carried out, for example, in the following manner. That is, the reaction vessel 3 is evacuated by actuating a vacuum pump (not shown) and opening the exhaust valve 4 to a desired vacuum degree. Then, the valve 11 is opened to introduce N$_2$ gas into the reaction vessel 3. At the same time, the valve 9 is opened to introduce SiH$_4$ gas into the reaction vessel 3. While observing the reading on the pressure gage 2, the gas pressure in the reaction vessel is adjusted to a desired value by regulating the exhaust valve 4. Then, the xenon lamp 16 is actuated to irradiate ultraviolet rays onto the surface of the wafer 6. Concurrently, an RF power is supplied from the RF power source 1 to the cathode electrode 7.

The RF power transmits through the insulating circumferential wall member 10 to cause glow discharge between the wall member 10 and the internal electrode 13. Said glow discharge takes place between the two coaxial electrodes 7 and 13 to produce plasmas of N$_2$ gas which are successively diffused from the outer peripheral portion of the wafer 6 toward the central portion thereof. Then, the plasmas react with SiH$_4$ gas spouted from the ring-shaped gas introducing pipe 8 to form a SiN deposited film on the surface of the wafer 6. During this process, ultraviolet rays emitted from the xenon lamp 16 are focused toward the wafer 6 by the mirror 17 and, passing through the light transmitting window 14 along the light path 18, irradiated onto the surface of the wafer 6.

The film forming rate of said SiN film on the surface of the wafer 6 depends upon the density of the plasmas of N$_2$ gas.

According to the apparatus of the present invention, the density of the plasmas of N$_2$ gas around the wafer 6 can be made uniform by properly adjusting the diameter of the internal electrode 13, the diameter of the wall member 10, the distance between the lower end of the internal electrode 13 and the surface of the substrate 6, or the position of the external electrode 7 depending upon the raw material gas used, the pressure of the raw material gas to be introduced into the system, or other related factors.

Thus, the foregoing apparatus according to the present invention always makes it possible to stably and repeatedly form a desirable high quality SiN deposited film having an uniform thickness over the entire surface of the substrate.

The following effects were obtained with the apparatus of the embodiment described above as a result of experiments.

(a) N$_2$ plasmas produced by an RF power diffuse radially and inwardly in a doughnut-like configuration from the outer peripheral portion of the substrate. Consequently, at the central portion of the substrate, the diffused plasmas from the opposite ends of the substrate overlap with each other, and consequently, the density of plasmas is made uniform over the entire surface of the substrate.

In particular, when an RF power of 0.6 w/cm$^2$ (200 W as a total) was applied to the cathode electrode 7 in an atmosphere of N$_2$ gas maintained at 10 mTorr, the density of electrons was $5 \times 10^9$ cm$^{-3}$ at the end portion of a 6-inch wafer and $4.5 \times 10^9$ cm$^{-3}$ at the central portion thereof.

Figure 8:
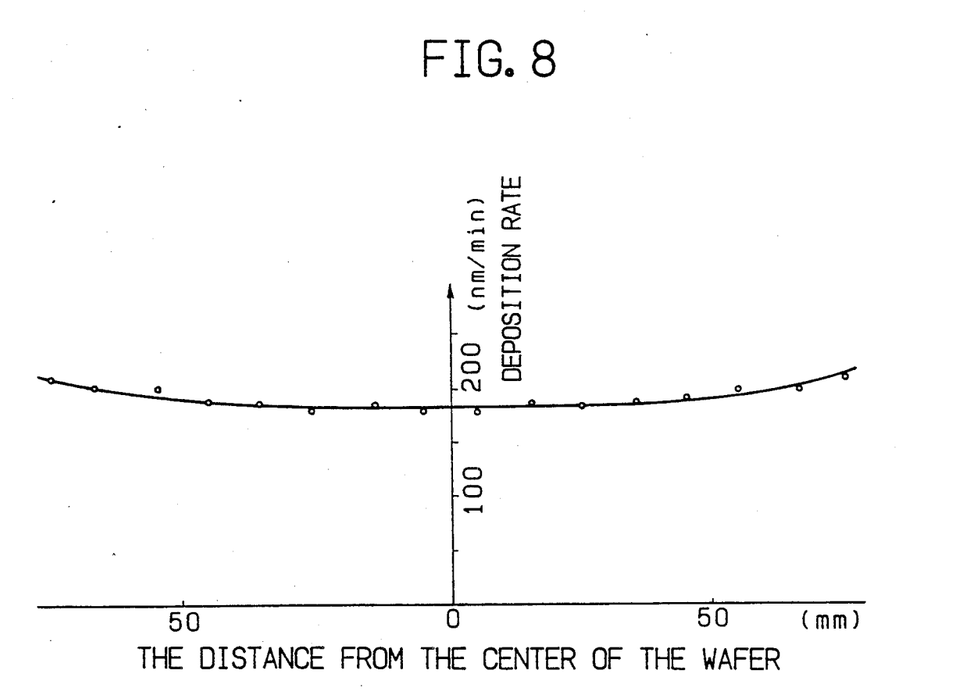
FIG. 8 is a graph showing a film forming rate for a 6-inch wafer when a film is formed by the apparatus shown in FIG. 1.

(b) In the above case, a film forming rate distribution within ±1.0% as shown in FIG. 8 was obtained without rotation of the substrate.

(c) The diameter of the reaction vessel could be reduced as much as twice or so over the diameter of the wafer.

Second Embodiment

Figure 2:
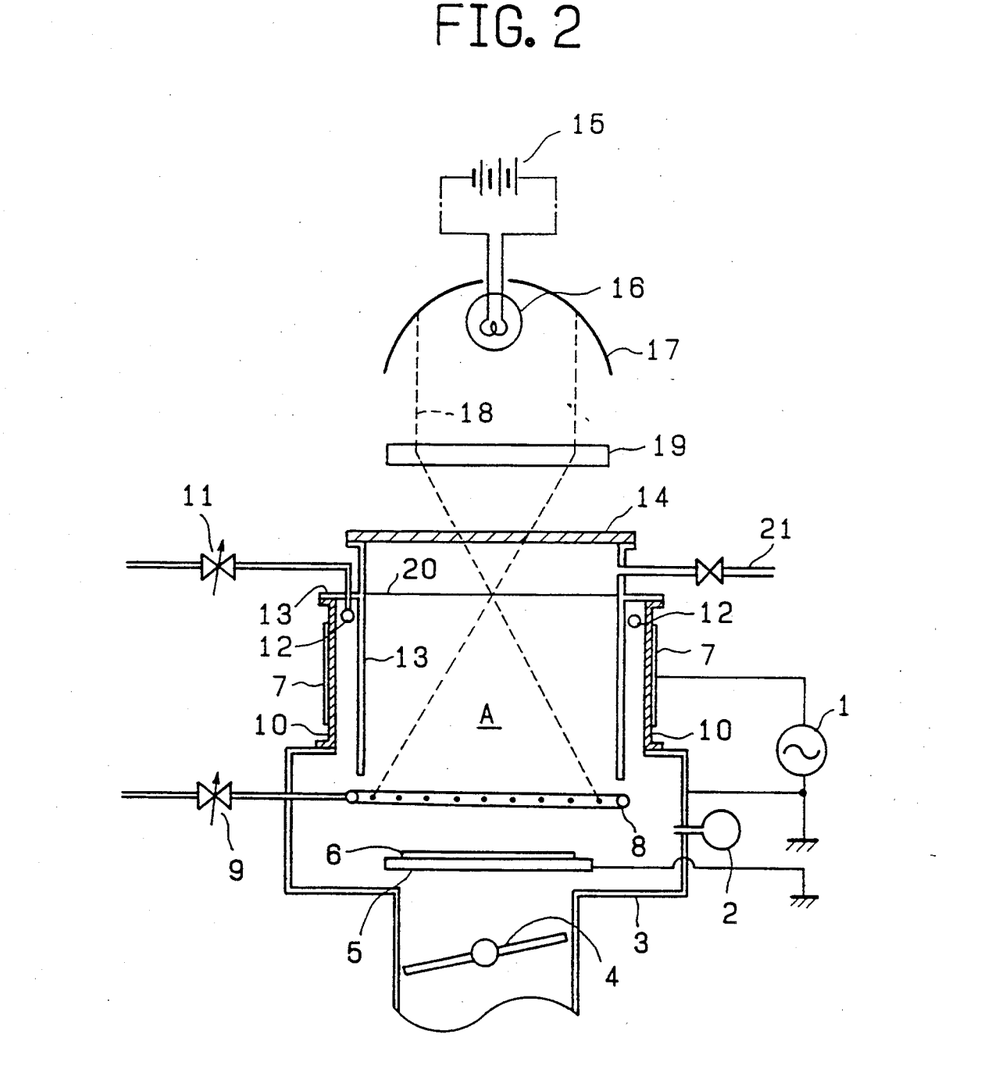
FIG. 2 is a similar view but showing another preferred embodiment of the present invention.

FIG. 2 shows a schematic sectional view of another embodiment of the hybrid excitation film-forming apparatus according to the present invention. The apparatus has a generally similar constitution to that of the apparatus of the first embodiment described above, and like parts or elements are denoted by like reference numerals to those of the apparatus shown in FIG. 1. The apparatus of this embodiment additionally includes a Fresnel lens 19, an orifice member 20, and a gas introducing pipe 21.

The apparatus shown in FIG. 2 is of an improvement in the method for activation of the surface of the substrate in the apparatus shown in FIG. 1. The Fresnel lens 19 is disposed between the light source 16 and the light introducing window 14 such that ultraviolet rays 18 from the light source 16 pass through the light introducing window 14 and are focused in a space A surrounded by the internal electrode 13. Further, the orifice member 20 having a plurality of orifices of a size substantially equal to a beam of ray is disposed at the focusing position in the space A. Thus, the substrate surface activating light 18 after passing through the orifice of the orifice member 20 expands again and is irradiated onto the surface of the substrate 6.

Formation of a deposited SiN film by the foregoing apparatus is practiced in a similar manner to that in the apparatus of the first embodiment described above. A desirable deposited SiN film having an uniform thickness can be formed by the apparatus. In the case of the apparatus of the present embodiment, formation of a deposited film on the light introducing window 14 can be effectively prevented. In particular, in the case of forming a SiN film as an example similarly as in the first embodiment, $N_2$ gas is introduced into the reaction vessel 3 and it is excited by plasma to generate $N_2$ active species which successively diffuse toward the surface of the substrate 6. Thereupon, some of the $N_2$ active species also diffuse toward the light introducing window 14. However, since the orifice member 20 is provided in the apparatus of the present embodiment, such $N_2$ active species are prevented from reaching the light introducing window 14 by the orifice member 20. Further with the apparatus, it is possible to introduce $N_2$ gas into the space defined by the orifice member 20 and the light introducing window 14 through a gas feed pipe 21 connected through the internal electrode to said space and then to spout toward the surface of the substrate 6 through the orifice of the orifice member 20. In this instance, the probability of $N_2$ active species reaching the light introducing window 14 is further reduced. Besides, with the apparatus of the present embodiment, since ultraviolet rays from the light source 16 are condensed once by the Fresnel lens 19 and then expanded again, the area of the substrate can be made great in the relationship with the size of the light introducing window 14, and consequently, formation of a deposited SiN film of a large area is enabled.

What we claim is:

1. In an apparatus for forming a deposited film on a substrate by the hybrid excitation chemical vapor deposition method, said apparatus comprising a substantially enclosed reaction vessel having means for holding said substrate thereon, a plasma generating means and means for irradiating light through a light introducing window provided with said reaction vessel to the surface of said substrate in said reaction vessel; the improvement that at least part of the circumferential side wall of said reaction vessel is hermetically constituted by an insulating member having an external cathode electrode member on the outer surface thereof, said external cathode electrode member being electrically connected to a high frequency power source, an internal electrode member to serve as the anode is installed in said reaction vessel at a position opposite to said external cathode electrode member, said internal electrode member being electrically grounded, said means for holding the substrate is positioned below said internal electrode member, said reaction vessel is provided with a gas feed pipe for supplying a raw material gas capable of producing a plasma which is open into the space between said insulating member and said internal electrode member, a light source for irradiating light to the surface of said substrate is disposed above said internal electrode member such that the path of said light is made coaxial with said reaction vessel, and said reaction vessel is provided with a gas feed pipe having a plurality of gas spouting holes for supplying a film-forming raw material gas above said means for holding the substrate.

2. The apparatus according to claim 1, wherein said raw material gas capable of producing a plasma is $N_2$ gas and said film-forming raw material gas is $SiH_4$ gas.

3. The apparatus according to claim 1, wherein said reaction vessel is cylindrical.

4. The apparatus according to claim 3, wherein said inner electrode member is cylindrical.

5. The apparatus according to claim 1, wherein an orifice member is disposed between said light introducing window and said means for holding the substrate, and a light irradiating system is so disposed that light introduced through the light introducing window into the reaction vessel may be focused at said orifice member.

6. The apparatus according to claim 5, wherein said raw material gas capable of producing a plasma is $N_2$ gas and said film-forming raw material gas is $SiH_4$ gas.

7. The apparatus according to claim 6 which is provided with a gas feed pipe for supplying $N_2$ gas into the space between the light introducing window and the orifice member.

* * * * *

UNITED STATES PATENT AND TRADEMARK OFFICE
CERTIFICATE OF CORRECTION

PATENT NO. : 4,989,544

DATED : February 5, 1991

INVENTOR(S) : TOSHIAKI YOSHIKAWA

It is certified that error appears in the above-identified patent and that said Letters Patent is hereby corrected as shown below:

COLUMN 2

Line 66, "water." should read --wafer.--.

COLUMN 3

Line 60, "CvD" should read --CVD--.

COLUMN 9

Line 38, "orifice" (first occurrence) should read --orifices--.

Signed and Sealed this

Thirteenth Day of October, 1992

Attest:

DOUGLAS B. COMER

Attesting Officer    Acting Commissioner of Patents and Trademarks